United States Patent
Zhou

(10) Patent No.: US 6,521,989 B2
(45) Date of Patent: *Feb. 18, 2003

(54) METHODS AND APPARATUS FOR HERMETICALLY SEALING ELECTRONIC PACKAGES

(75) Inventor: Ping Zhou, Glendale, AZ (US)

(73) Assignee: Honeywell Inc., Morristown, NJ (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/169,511

(22) Filed: Oct. 8, 1998

(65) Prior Publication Data

US 2002/0005574 A1 Jan. 17, 2002

(51) Int. Cl.[7] .......................... H01L 23/22; H01L 23/24
(52) U.S. Cl. .................. 257/698; 257/687; 257/690; 257/710; 257/789; 257/795; 257/794; 361/820; 174/52.3
(58) Field of Search ..................... 257/696, 698, 257/690, 687, 710, 795, 789, 794; 361/820; 174/52.3; 438/124, 126

(56) References Cited

U.S. PATENT DOCUMENTS

| | | |
|---|---|---|
| 4,130,343 A | 12/1978 | Miller et al. |
| 4,165,496 A | 8/1979 | Di Domenico, Jr. et al. |
| 4,381,882 A | 5/1983 | Sabine |
| 4,403,273 A | 9/1983 | Nishioka |
| 4,653,844 A | 3/1987 | Ward |
| 4,784,974 A * | 11/1988 | Butt ........................ 437/221 |
| 4,865,417 A | 9/1989 | Yamamoto Naohiro et al. |
| 4,981,334 A | 1/1991 | Sniadower |
| 5,030,796 A * | 7/1991 | Swanson et al. ........... 174/52.2 |
| 5,146,516 A | 9/1992 | Blumke et al. |
| 5,163,113 A | 11/1992 | Melman |
| 5,253,312 A | 10/1993 | Payne et al. |
| 5,262,364 A | 11/1993 | Brow et al. |
| 5,291,572 A | 3/1994 | Blonder et al. |
| 5,357,103 A * | 10/1994 | Sasaki ................... 250/227.24 |
| 5,390,271 A | 2/1995 | Priest |
| 5,399,805 A * | 3/1995 | Tyler et al. ................. 174/52.4 |
| 5,399,825 A * | 3/1995 | Tyler et al. ................. 174/52.2 |
| 5,499,309 A | 3/1996 | Kozuka et al. |
| 5,533,158 A | 7/1996 | Han et al. |
| 5,671,315 A | 9/1997 | Tabuchi et al. |
| 5,700,724 A * | 12/1997 | Ships ........................ 437/215 |
| 5,724,464 A | 3/1998 | Kozuka |
| 5,734,765 A | 3/1998 | Artjushenko et al. |
| 5,748,822 A | 5/1998 | Miura et al. |

FOREIGN PATENT DOCUMENTS

| | | | |
|---|---|---|---|
| EP | 0331331 A2 * | 9/1989 | ............ G02B/6/42 |
| EP | 0 331 331 A2 | 9/1989 | |
| EP | 0 517 967 A1 | 12/1992 | |
| EP | 0 704 731 A1 | 4/1996 | |
| GB | 004133829 A1 * | 4/1993 | ................. 257/696 |
| JP | 405144976 A * | 6/1993 | ................. 257/696 |
| JP | 406132440 A * | 5/1994 | ................. 257/696 |
| JP | 406132453 A * | 5/1994 | ................. 257/696 |

OTHER PUBLICATIONS

Satoshi Ito et al.; Study of Encapsulating System for Diversified Area Bump Packages; 1997 Electronic Components and Technology Conference; pp. 46–59.

(List continued on next page.)

*Primary Examiner*—Eddie Lee
*Assistant Examiner*—Matthew E. Warren

(57) ABSTRACT

An electronic package and/or package lid includes at least one connection slot for receiving a line, such as an optical fiber. The package and/or package lid also includes at least one sealant slot proximate the connection slot. Optical fibers are connected to a component, such as an opto-electronic component, through the connection slot. A sealant provided via the sealant slot hermetically seals the optical fibers within the connection slot.

41 Claims, 15 Drawing Sheets

OTHER PUBLICATIONS

Tom Swirbel; Process of Fabricating Thin Film Multilayer Modules Using Photosensitive Epoxy Dielectrics; 1997 Electronic Components and Technology Conference; pp. 967–971.

Semiconductor Technology, R&D Universe of Innovations; R&D; vol. 38, No. 10, p. 53; Sep. 1996.

Lawrence D. Schwartz; Sealing Electrical Connectors in Industrial Environments; Silicone Gels; Technology Focus; EDN; vol. 41, No. 5A, p. 36; Mar. 7, 1996.

Roger L. Jungerman, David M. Braun, Kari K. Salomaa; Dual–Output Laser Module for a Tunable Laser Source; Technical; Hewlett–Packard Journal; vol. 44, No. 1, p. 32; Feb. 1993.

Alan S. Brown; Electronics Show Their Age; Aerospace America; Electronics; p. 22; Oct. 1992.

Douglas Bahniuk; New Designs Make Sensors Easy to Use; Machine Design; vol. 59, p. 66; Jun. 25, 1987.

* cited by examiner

METHODS AND APPARATUS FOR HERMETICALLY SEALING ELECTRONIC PACKAGES

The United States Government has acquired certain rights in this invention pursuant to Contract No. N00024-98-2-4022 awarded by the United States Department of the Navy.

BACKGROUND OF THE INVENTION

1. Field of the Invention

The present invention generally relates to methods and apparatus for component packaging and more particularly to systems for sealing opto-electronic components within standard chip packages.

2. Description of the Related Art

The use of opto-electronic components, such as laser diodes, photodetectors, and integrated optic chips, is becoming increasingly popular. Typically, opto-electronic components are packaged in transistor outlined packages, more commonly known as "TO Packages" or "TO Cans", or special photonic packages for use in various applications such as communications systems, industrial and/or aviation control systems.

The performance of opto-electronic components may be adversely affected by environmental contaminants such as dust, moisture, and industrial chemicals. For example, moisture absorbed into a component's substrate may condense on the surface of the component and freeze. Ice formation can damage or seriously affect the component. Similarly, corrosive materials, dust or other environmental impurities can impair component performance, or even cause the component to fail. Consequently, component isolation from environmental effects is frequently a design issue. A common solution is to hermetically seal the packages containing the opto-electronic components to protect them from dust, moisture, and other environmental contaminants.

One challenge to hermetically sealing opto-electronic packages, however, is hermetically sealing the feedthrough for optical fibers or wires connected to the opto-electronic components. With reference to FIG. 1, a conventional opto-electronic package 100 includes an opto-electronic component 104 disposed within a customized package 102. A plurality of optical fibers 106 is connected to opto-electronic component 104 through a plurality of feedthroughs 108. More particularly, with additional reference to FIG. 2, feedthrough 108 includes a metal tube 204 mounted on chip carrier 102. Optical fiber 106 passes through tube 204 and connects to opto-electronic component 104. The outer surface of optical fiber 106 is metallized such that a solid metallic mass 200 may be formed using any convenient method (such as soldering, welding, and the like) to hermetically seal optical fiber 106 within tube 204. A compliant and flexible sleeve 202 covers tube 204 and optical fiber 106 to provide tension relief to optical fiber 106. A flat lid (not shown) is then hermetically sealed to the top portion of chip carrier 102.

The conventional system described above, however, has numerous shortcomings. For example, as the feedthrough tubes 204 for the optical fibers 106 are mounted on the chip carrier 102, a custom built package is generally needed, which contributes to increased development and production costs. Additionally, although multiple optical fibers 106 may be fed through a larger diameter tube 204, it may be difficult to connect the various optical fibers 106 to the appropriate sites on the opto-electronic component 104 from a single tube. Therefore, more typically, a separate tube 204 is dedicated to each optical fiber 106 and positioned near its connection site on the opto-electronic component 104. Accordingly, the profile of the overall opto-electronic package 100 may be quite large for large numbers of optical fibers 106. Additionally, if the connection site of any optical fiber 106 is altered, the package 102 may need to be rebuilt, which also contributes to additional development and production costs.

SUMMARY OF THE INVENTION

In accordance with an exemplary embodiment of the present invention, a package and/or package lid includes at least one connection slot for receiving a line, such as an optical fiber. The package and/or package lid also includes at least one sealant slot proximate the connection slot. Optical fibers are connected to a component, such as an opto-electronic component, through the connection slot. A sealant provided via the sealant slot hermetically seals the optical fibers within the connection slot.

BRIEF DESCRIPTION OF THE DRAWINGS

The subject matter of the invention is particularly pointed out and distinctly claimed in the concluding portion of the specification. The invention, however, both as to organization and method of operation, may best be understood by reference to the following description taken in conjunction with the claims and the accompanying drawing, in which like parts may be referred to by like numerals:

DETAILED DESCRIPTION OF THE PREFERRED EXEMPLARY EMBODIMENTS

Figure 1:
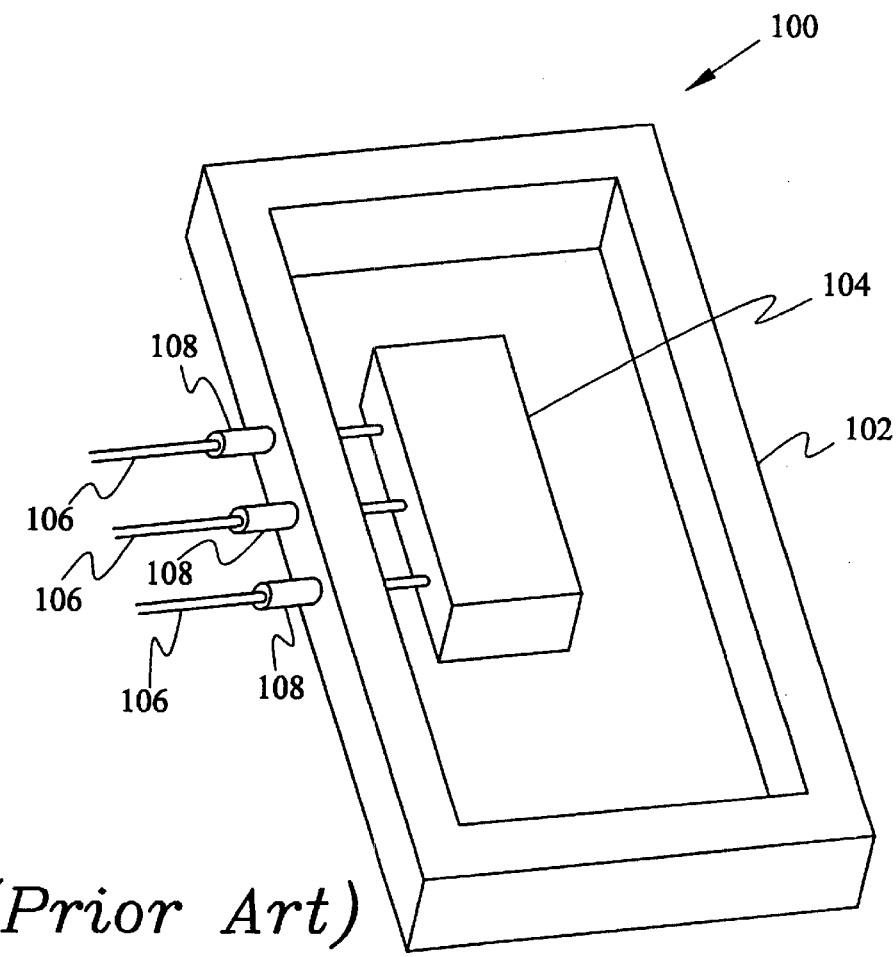
FIG. 1 is a perspective view of a prior art system for hermetically sealing an opto-electronic package.
Figure 2:
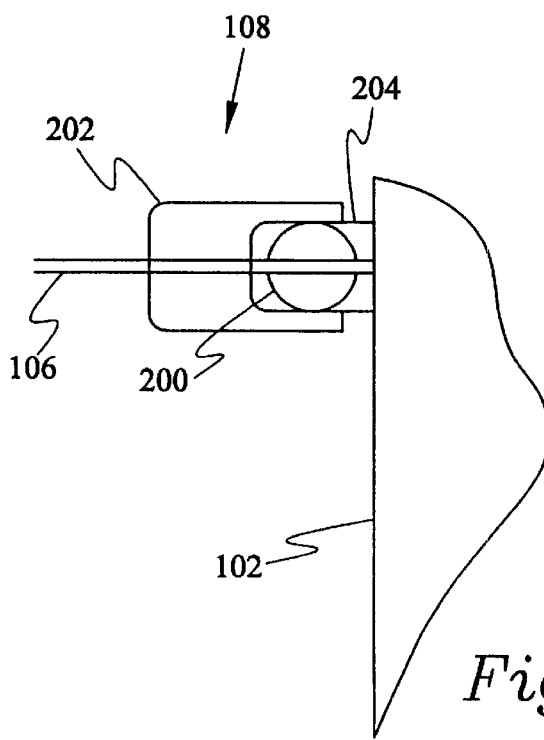
FIG. 2 is a top view of a portion of the prior art system shown in FIG. 1.

The subject matter of the present invention is particularly suited for use in connection with electronic components, particularly opto-electronic components. As a result, a preferred exemplary embodiment of the present invention is described in that context. It should be recognized, however, that such description is not intended as a limitation on the use or applicability of the present invention, but is instead provided to enable a full and complete description of the preferred embodiments.

A hermetic sealing system according to various aspects of the present invention suitably provides for sealing opto-electronic components in chip packages. The chip packages are suitably configured to be compatible with surface mount, lead frame, Multi Chip Module (MCM), or any other appropriate package and/or mounting technology. With reference to FIGS. 3 through 6, in an exemplary embodiment, a packaged component suitably comprises: a chip carrier 312; a component 306; at least one connection 308; and a lid 400. With additional reference to FIGS. 23 to 33, the chip carrier 312 may comprise any suitable component receptacle such as quad package 2300 with side flat leads or J-leads, pin grid array package 2500, column grid array package 2800, ball grid array package 3100, and the like. In a preferred embodiment, the chip carrier 312 is preferably a surface mount chip carrier with a plurality of terminals 310 to facilitate connections to other components, circuits, and the like. Chip carrier 312 is suitably configured with a metal rim 302, suitably formed from a high temperature alloy with a low thermal expansion coefficient, such as the commercially available product KOVAR. Additionally, metal rim 302 is suitably coated with a solderable and corrosion resistant material, such as zinc, tin, lead, copper, and the like.

Figure 21:
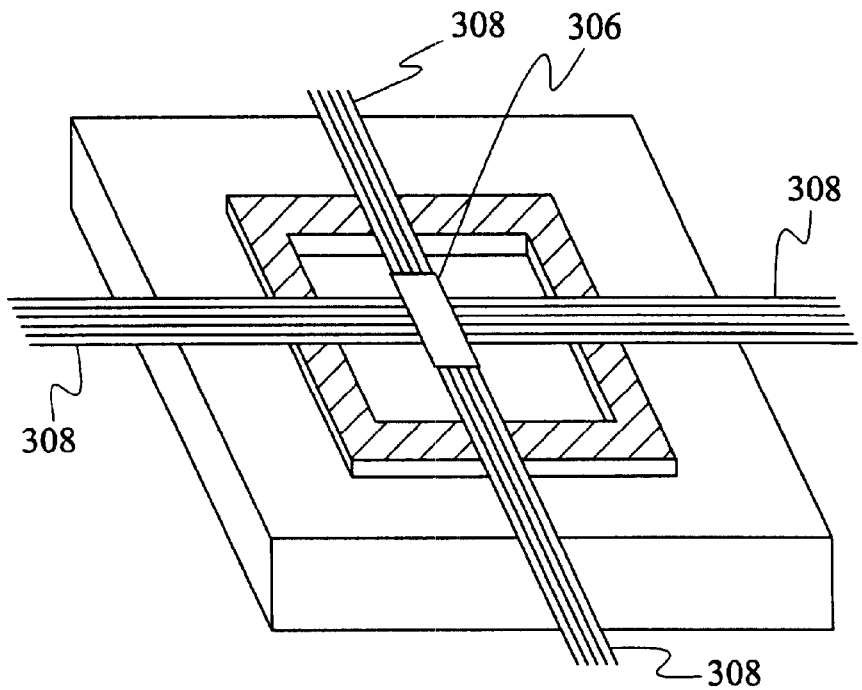
FIG. 21 is a perspective view of an optical package configured with multiple optical fiber leads in accordance with various aspects of the present invention.
Figure 22:
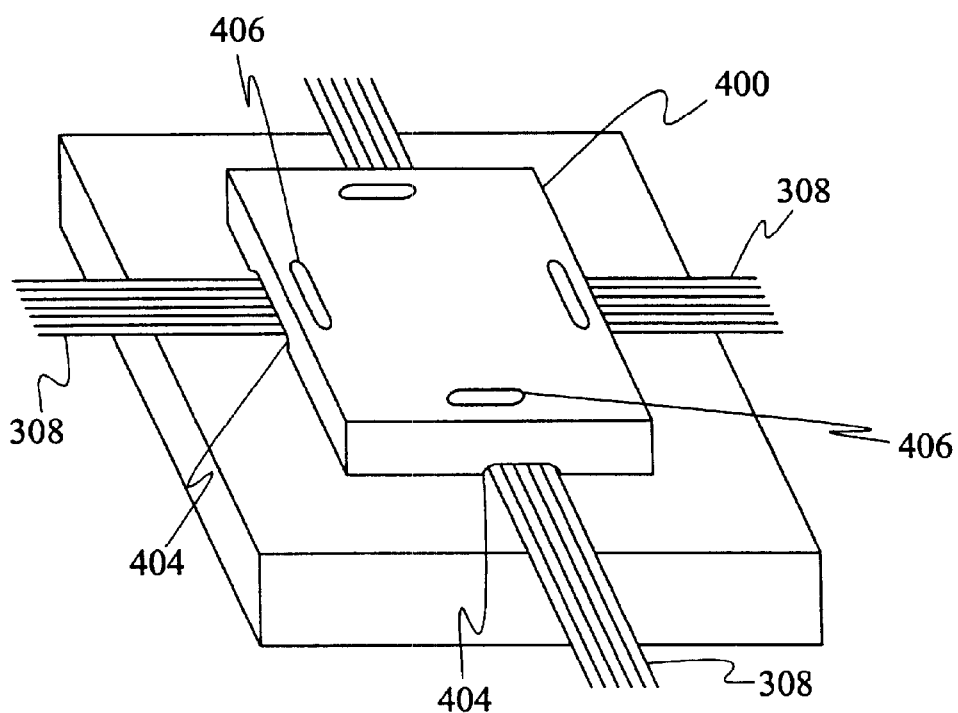
FIG. 22 is a perspective view of the optical package shown in FIG. 21 configured with a lid in accordance with various aspects of the present invention.
Figure 23:
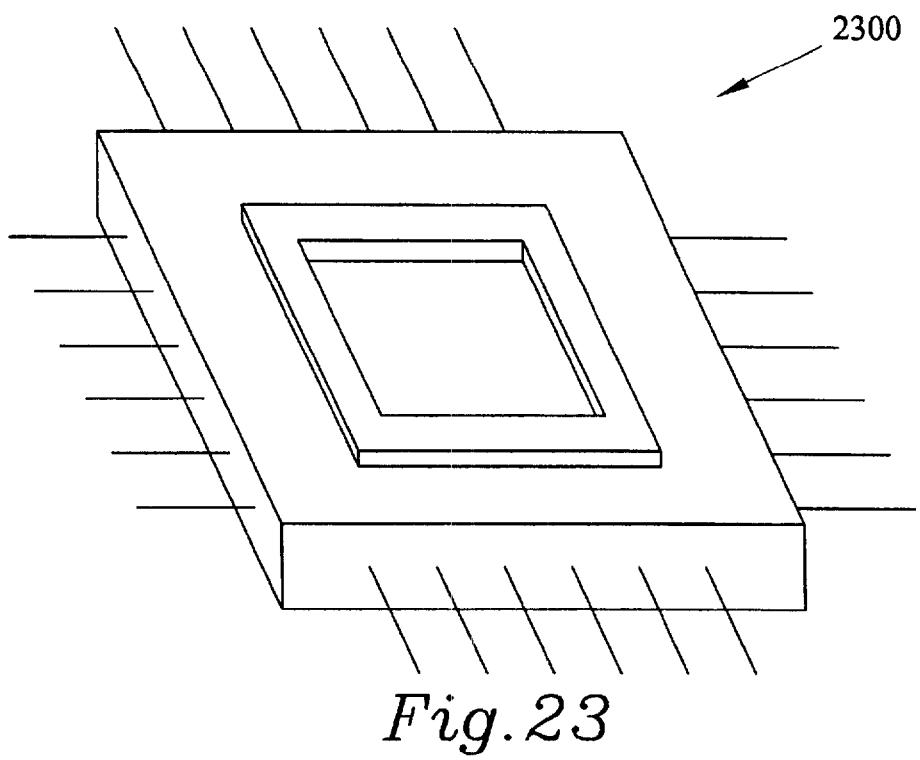
FIG. 23 is a perspective view of a quad package in accordance with various aspects of the present invention.
Figure 24:
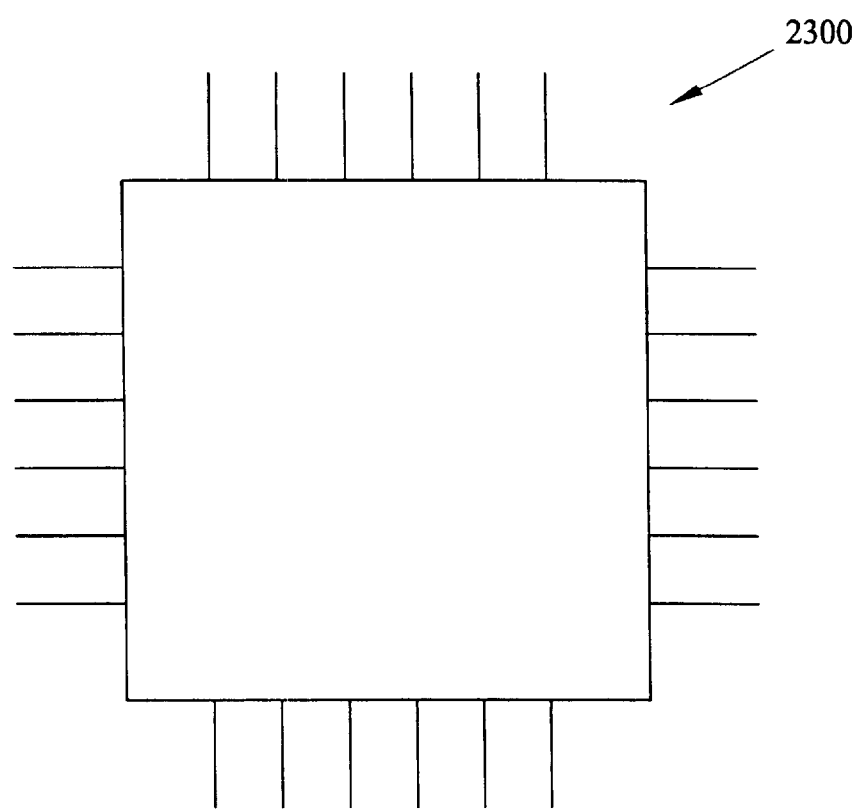
FIG. 24 is a bottom view of the quad package shown in FIG. 23.
Figure 25:
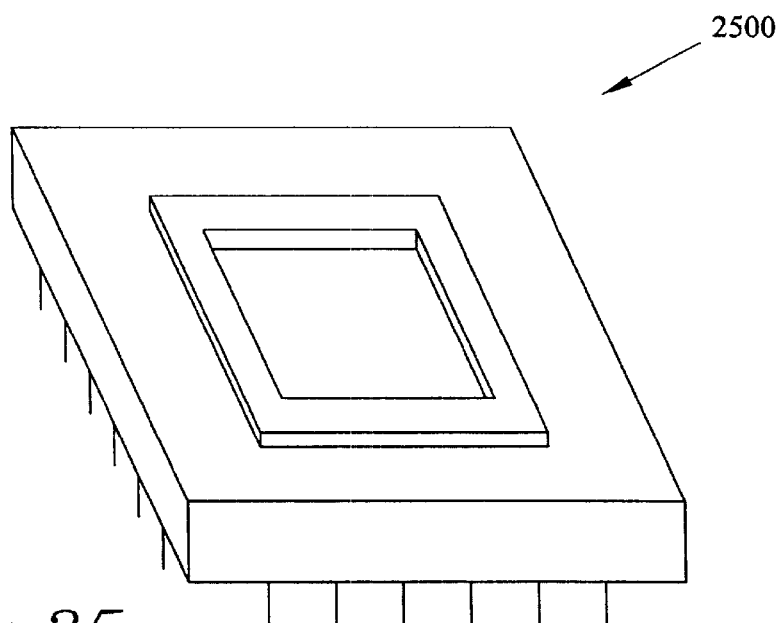
FIG. 25 is a perspective view of a pin grid array package in accordance with various aspects of the present invention.
Figure 26:
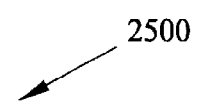
FIG. 26 is a bottom view of the pin grid array package shown in FIG. 25.
Figure 26:
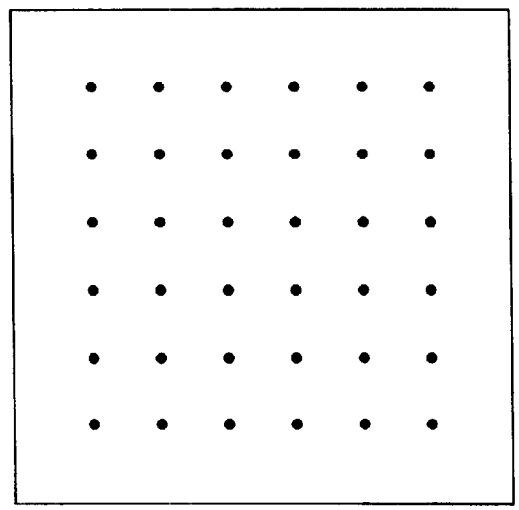
Figure 27:
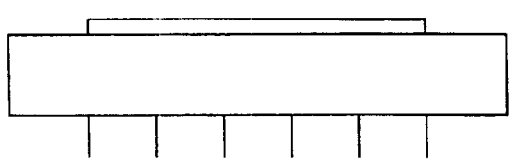
FIG. 27 is an elevational view of the pin grid array package shown in FIG. 25.
Figure 28:
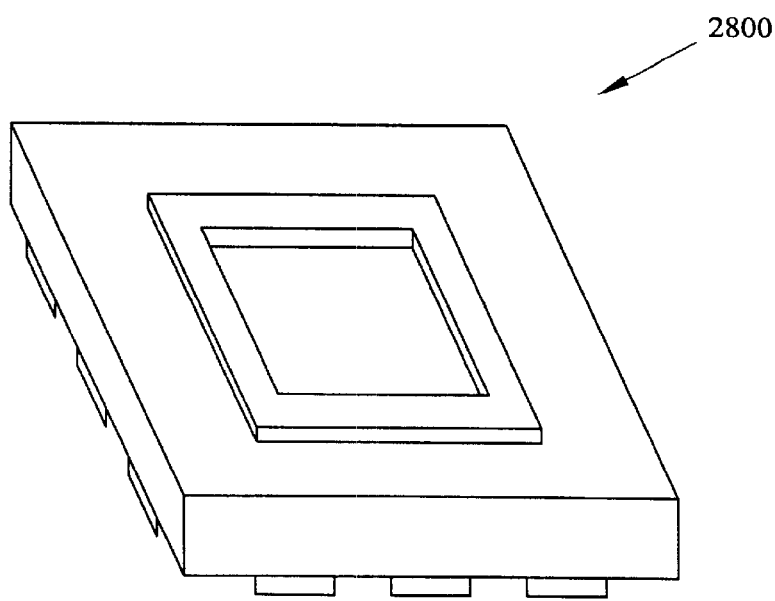
FIG. 28 is a perspective view of a column grid array package in accordance with various aspects of the present invention.
Figure 29:
FIG. 29 is a bottom view of the column grid array package shown in FIG. 28.
Figure 29:
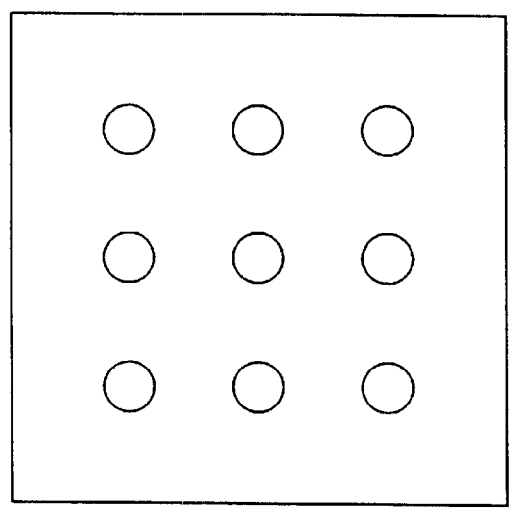
Figure 30:
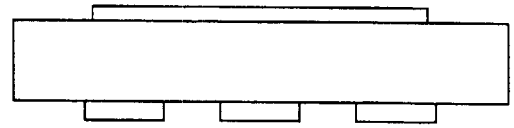
FIG. 30 is an elevational view of the column grid array package shown in FIG. 28.
Figure 31:
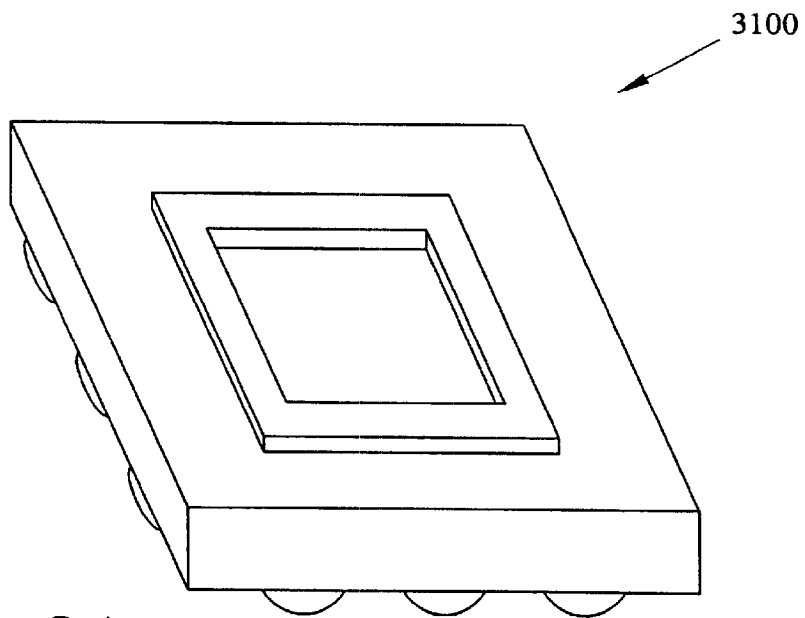
FIG. 31 is a perspective view of a ball grid array package in accordance with various aspects of the present invention.
Figure 32:
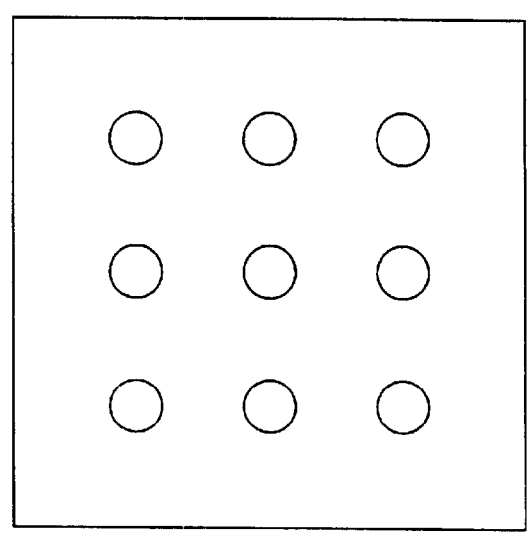
FIG. 32 is a bottom view of the ball grid array package shown in FIG. 31.
Figure 33:
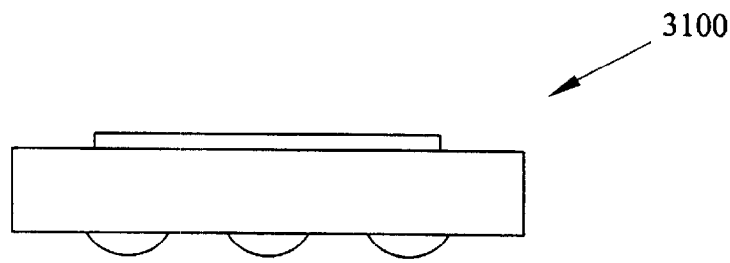
FIG. 33 is an elevational view of the ball grid array package shown in FIG. 31.

With continued reference to FIGS. 3 through 6, the component 306 suitably comprises an opto-electronic component, such as a laser diode, an optic chip, and the like, and is suitably mounted on chip carrier 312. The connection 308 suitably comprises a plurality of optical fibers 308 connected to the component 306. When multiple optical fibers 308 are used, the optical fibers 308 may be mounted on silicon v-grooves to suitably support and separate the fibers 308. In a preferred embodiment, multiple optical fibers 308 are suitably configured as flat ribbon fiber. As discussed in greater detail below, optical fibers 308 are coated with suitable metals (such as zinc, tin, lead, copper, nickel, and the like) to facilitate solder adhesion and corrosion resistance. In a preferred embodiment, optical fibers 308 are coated with gold and nickel (available from Spectran of Avon, Connecticut). Although one set of optical fibers 308 is depicted in FIGS. 3 through 6, any number of single or multiple optical fibers, or any combination thereof, may be connected to opto-electronic component 306. For example, with reference to FIGS. 21 and 22, two or more sides of opto-electronic component 306 may be connected to any number of optical fibers. Alternatively, opto-electronic component 306 may be configured in an elliptical configuration with optical fibers connected radially. Further, connection 308 may comprise any appropriate connection, such as a wire or a waveguide.

Figure 5:
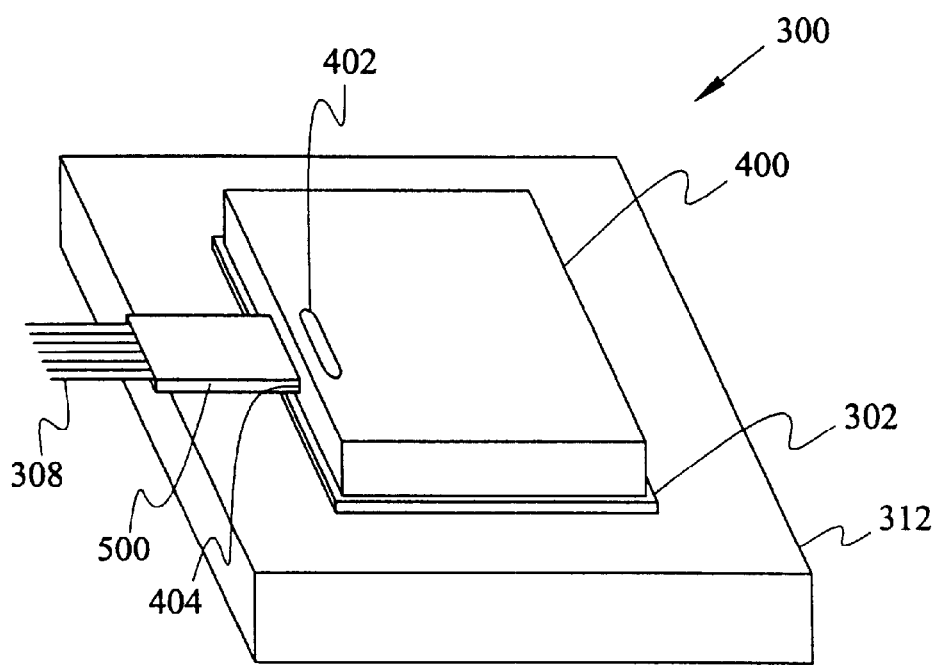
FIG. 5 is a perspective view of a hermetically sealed opto-electronic package in accordance with various aspects of the present invention.
Figure 6:
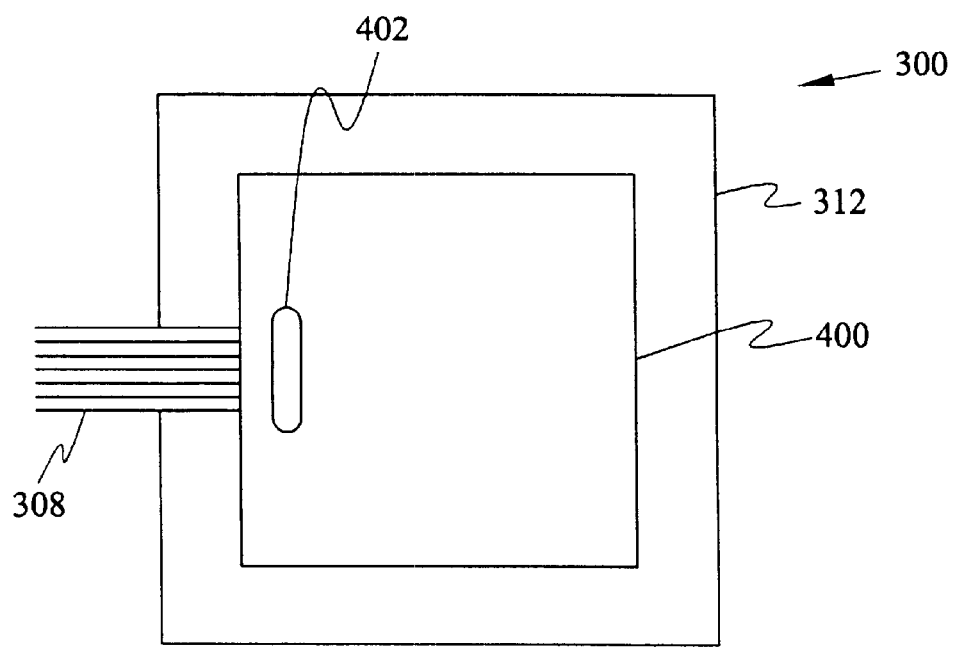
FIG. 6 is a top view of the hermetically sealed opto-electronic package shown in FIG. 5.
Figure 7:
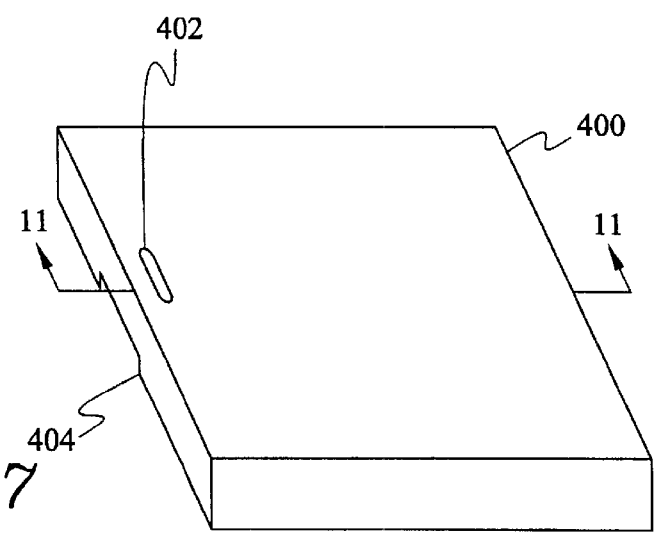
FIG. 7 is a perspective view of a lid in accordance with various aspects of the present invention.

With particular reference to FIGS. 5 and 6, in accordance with various aspects of the present invention, the lid 400 is suitably disposed on chip carrier 312. Lid 400 is preferably configured as a rigid structure and may be formed of any appropriate strong and rigid material, and is preferably solderable and corrosion resistant. In an exemplary embodiment, package lid 400 is formed from a high temperature alloy with low thermal expansion coefficient material, such as the commercially available product KOVAR. For lid materials that are not generally solderable or corrosion resistant, lid 400 is suitably coated, for example electroplated in solderable and corrosion resistant material such as zinc, tin, lead, copper, and the like. In a particular preferred embodiment, lid 400 is electroplated in 50 to 150 microinches of electroless nickel in accordance with military standard MIL-C-26074 Class 1, followed by 50 to 150 microinches of gold in accordance with military standard MIL-G-45204, type III, grade A.

Figure 12:
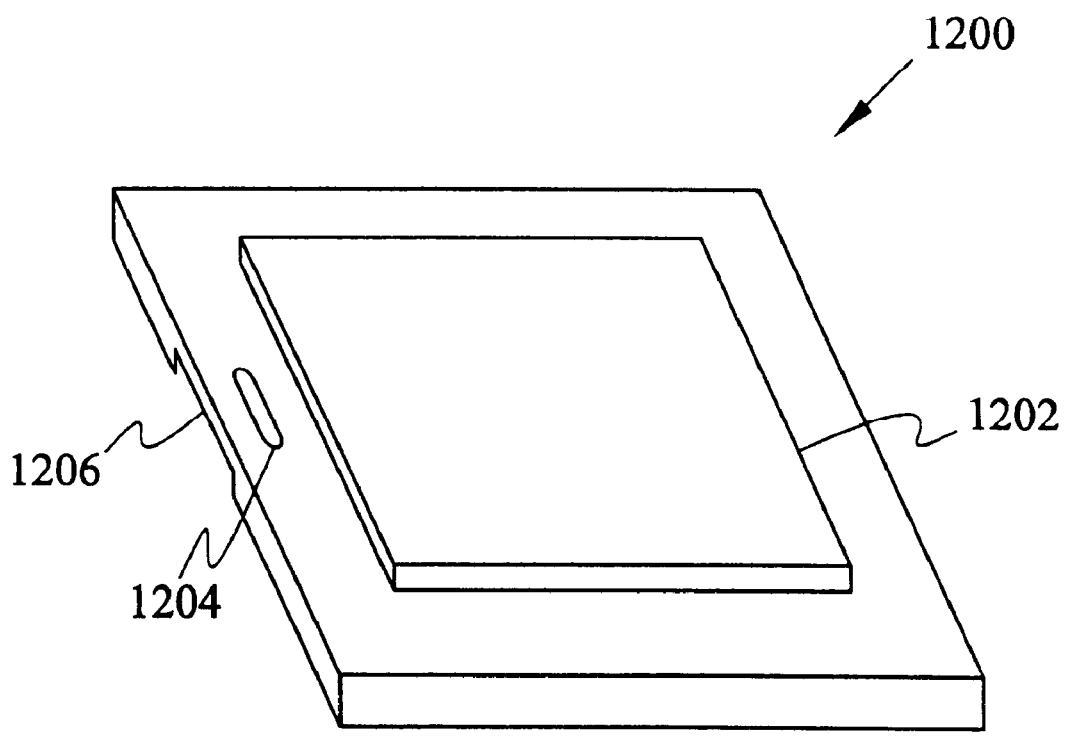
FIG. 12 is a perspective view of a lid having an alternative configuration in accordance with various aspects of the present invention.

With reference again to FIG. 5, lid 400 may be formed using any convenient method such as machining, stamping, and the like. For example, if only a small number of lids are required, machining may be a more cost effective method than stamping. In contrast, for large numbers of package lids, stamping may be more cost effective. Alternatively, in some applications, these two methods may be combined. For example, a large number of standard lids may be formed by stamping and customized for particular applications by machining. Additionally, with reference to FIG. 12, when stamping is used, package lid 1200 may be configured with a raised cavity 1202 rather than a recessed cavity (FIG. 9) for ease of manufacture.

Figure 8:
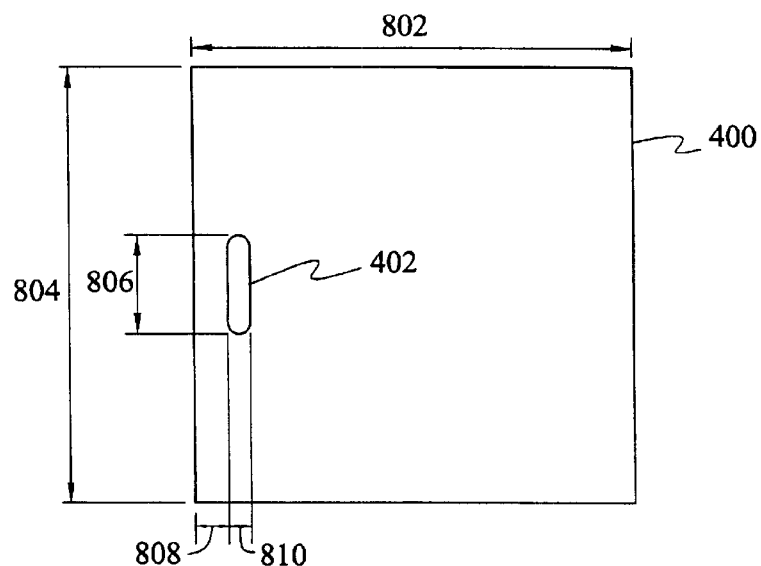
FIG. 8 is a top view of the lid shown in FIG. 7.
Figure 9:
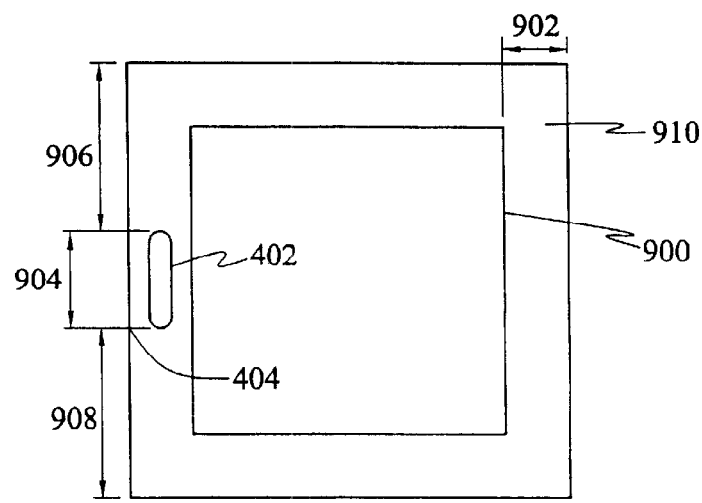
FIG. 9 is a bottom view of the lid shown in FIG. 7.
Figure 10:
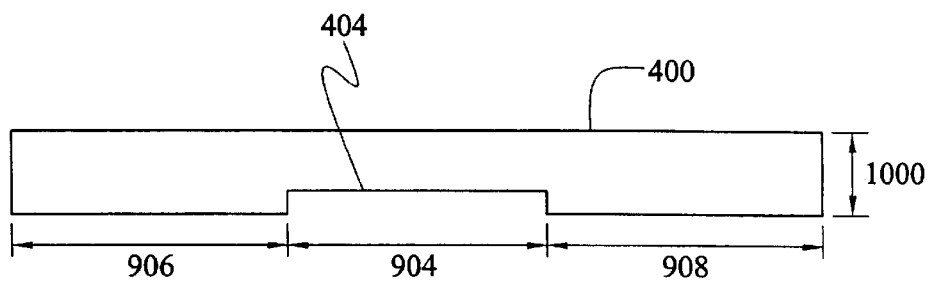
FIG. 10 is a front elevational view of the lid shown in FIG. 7.

Additionally, lid 400 may be configured in any appropriate shape and dimensions for particular applications. For example, lid 400 may be rectangular to substantially conform with rectangular rim 302. Similarly, package lid 400 may be relatively tall or short to accommodate the height of opto-electronic component 306. With reference to FIGS. 8 through 10, in an exemplary embodiment of the present invention, lid 400 is preferably substantially square in shape with lengths 802 and 804 of about 0.522 inches and thickness 1000 of about 0.046 inches.

Figure 3:
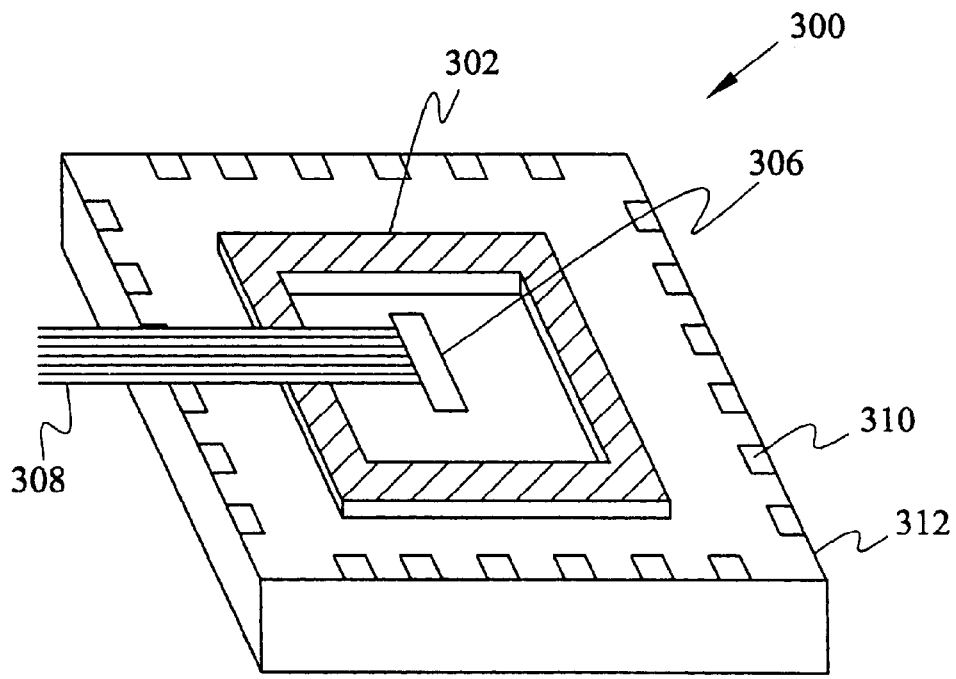
FIG. 3 is a perspective view of an opto-electronic package in accordance with various aspects of the present invention.
Figure 4:
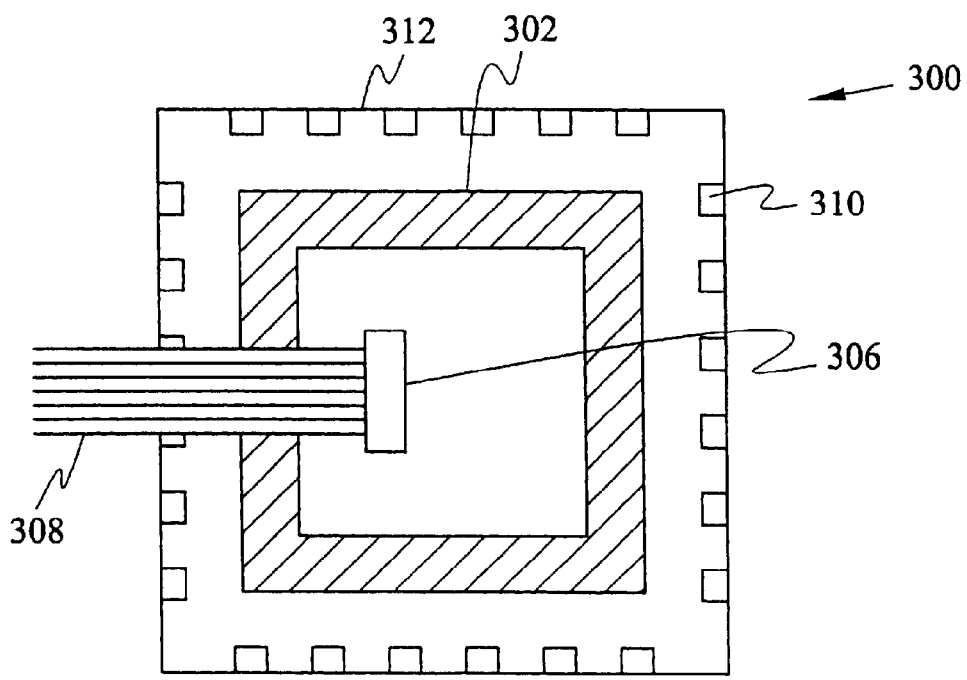
FIG. 4 is a top view of the opto-electronic package shown in FIG. 3.
Figure 11:
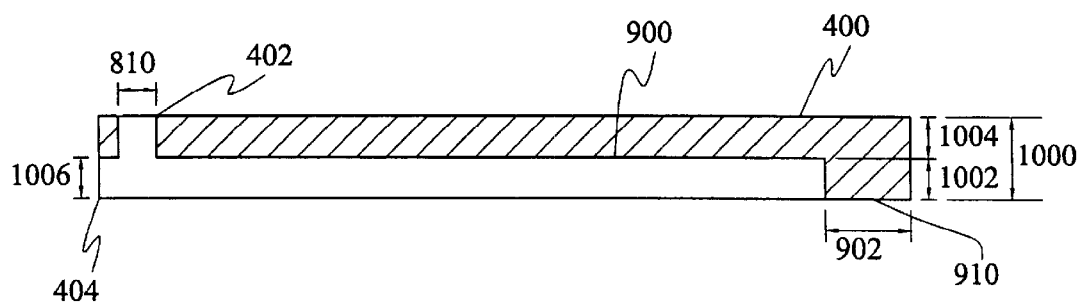
FIG. 11 is a cross sectional view of the lid shown in FIG. 7 taken through line 11—11.

With reference to FIGS. 9 and 11, a cavity 900 is suitably formed in the underside of lid 400 to provide clearance for opto-electronic component 306 and plurality of optical fibers 308 (FIG. 3). A lip 410 is suitably configured to substantially conform with metal rim 304 (FIG. 3). In an exemplary embodiment of the present invention, the thickness 1002 of cavity 900 is about 0.23 inches, and the thickness 902 of lip 910 is about 0.061 inches.

A component package according to various aspects of the present invention includes a connection slot and a sealant slot. For example, as particularly depicted in FIG. 5, at least one connection slot 404 is suitably configured in lid 400 as access for optical fibers 308. More particularly, with reference to FIGS. 9 and 11, connection slot 404 is suitably formed through lip 910 and into cavity 900. Additionally, sealant slot 402 and is formed proximate, such as above, and opens into connection slot 404. As described in greater detail below, when a sealant, such as solderable material, disposed in sealant slot 402 melts, it flows through sealant slot 402 to hermetically seal optical fibers 308 within connection slot 404. A compliant and flexible sleeve 500 is suitably secured to optical fibers 308 and attached to lid 400 using adhesive material, such as epoxy, to provide tension relief.

Although one connection slot 404 and one sealant slot 406 are depicted, any number of connection slots and sealant slots may be disposed at any number of locations around the perimeter of lid 400. For example, with additional reference to FIG. 22, four connection slots 404 and four sealant slots 406 are suitably configured in lid 400 as access for four sets of optical fibers 308. Additionally, the dimensions of sealant slot 406 are suitably selected to facilitate use of a sufficient amount of sealant to hermetically seal plurality of optical fibers 308 in connection slot 404. In an exemplary embodiment of the present invention, length 806 of sealant slot 402 and length 904 of connection slot 404 are about 0.230 inches. Width 810 of sealant slot 402 is about 0.023 inches. Thickness 1006 of connection slot 404 is about 0.008 inches.

Figure 13:
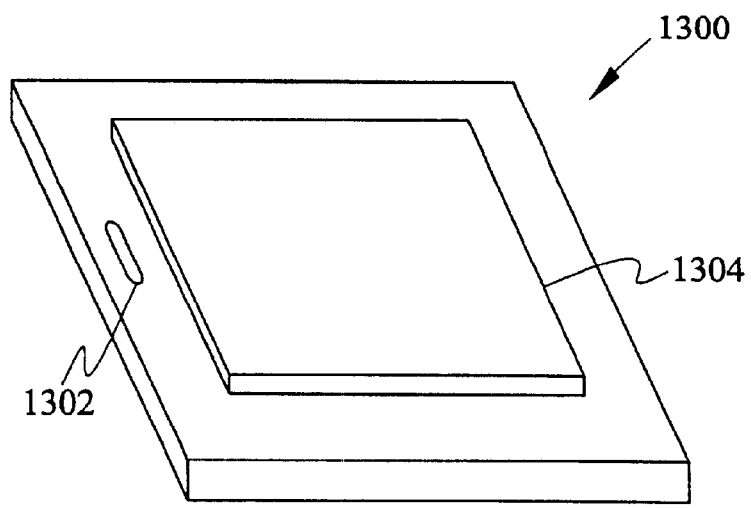
FIG. 13 is a perspective view of a lid having an additional alternative configuration in accordance with various aspects of the present invention.
Figure 14:
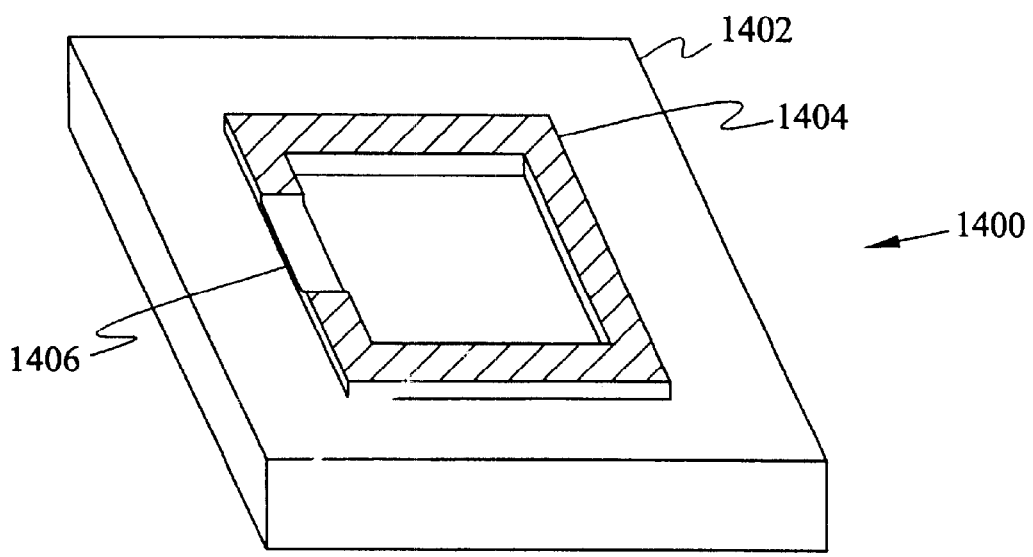
FIG. 14 is a perspective view of a chip carrier configured in accordance with various aspects of the present invention.

In accordance with an alternative embodiment of the present invention, connection slots may be formed in the main package rather than the lid. More particularly, with reference to FIGS. 13 and 14, in main package 1400, connection slot 1406 is suitably formed in metal rim 1404 of chip carrier 1402. Lid 1300 includes sealant slot 1302 for receiving sealant to seal optical fibers fed through connection slot 1406 and into cavity 1304. This configuration may be advantageous in applications where modification of chip carrier 1402 may be simpler and more cost effective than modifying lid 1300.

With reference to FIGS. 3 and 5, a preform of corrosion resistant solder material (such as gold-tin, lead-tin, indium based solder, and the like) is suitably attached to lid 400 or metal ring 302. Package lid 400 is suitably sealed to metal ring 302, for example using any convenient welding method, such as projection and seam electrical welding, electron and laser beam welding, and the like, to reflow the solder material disposed between lid 400 and metal ring 302. In addition, localized heat (such as hot air) is suitably applied to connection slot 404 and sealant slot 402 to reflow sealant, such as corrosion resistant solder material, disposed in sealant slot 402. More particularly, the solder material flows down into connection slot 404 and adheres to the metallized coating of optical fibers 308 to form a hermetic seal. In this manner, heat damage to opto-electronic component 306 (FIG. 3) may be reduced. Alternatively, if opto-electronic component 306 is resistant to heat damage, the entire assembly can be placed into an oven for solder reflow.

Figure 15:
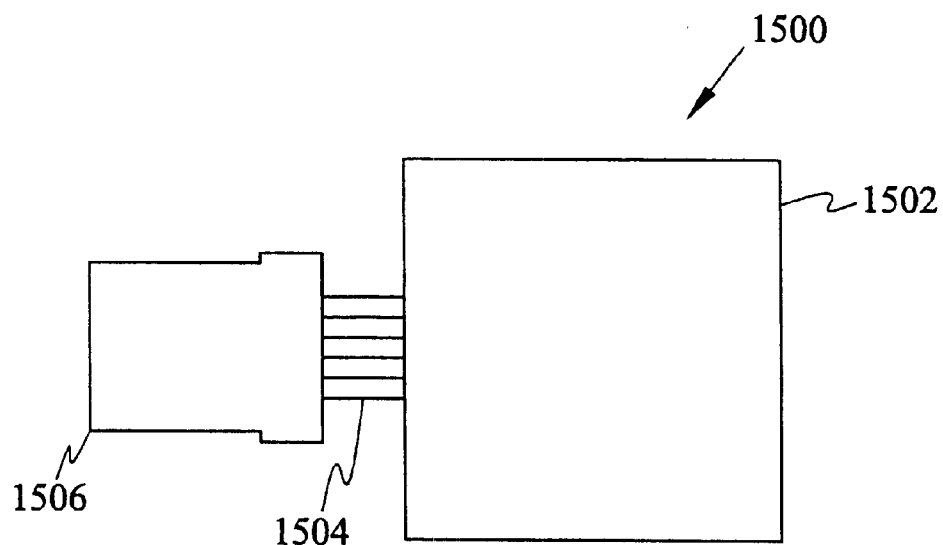
FIG. 15 is a plan view of a fiber optical pigtail interface in accordance with various aspects of the present invention.
Figure 16:
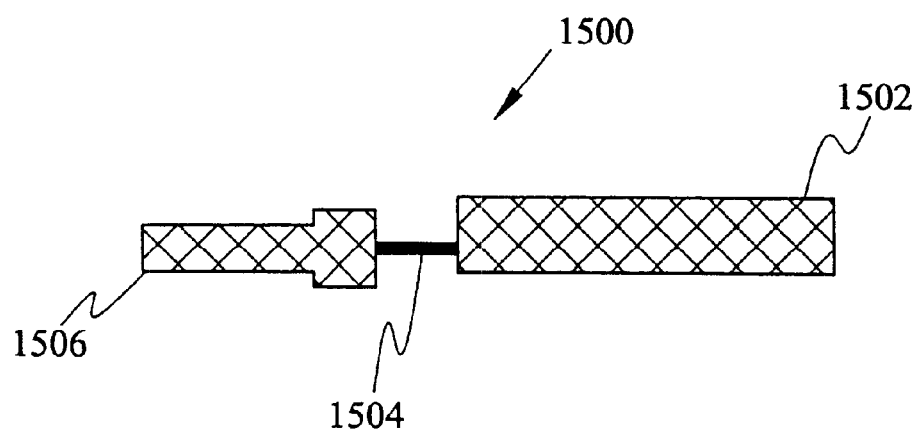
FIG. 16 is an elevational view of the interface shown in FIG. 15.

In accordance with various aspects of the present invention, a hermetically sealed opto-electronic package may be configured with various interface schemes. For example, with reference to FIGS. 15 and 16, a pigtail interface scheme 1500 includes hermetically sealed opto-electronic package 1502 which is connected to a ferrule 1506 by an optical fiber pigtail 1504. Ferrule 1506 is preferably standardized to facilitate flexible connections to other components, circuits, and the like.

Figure 17:
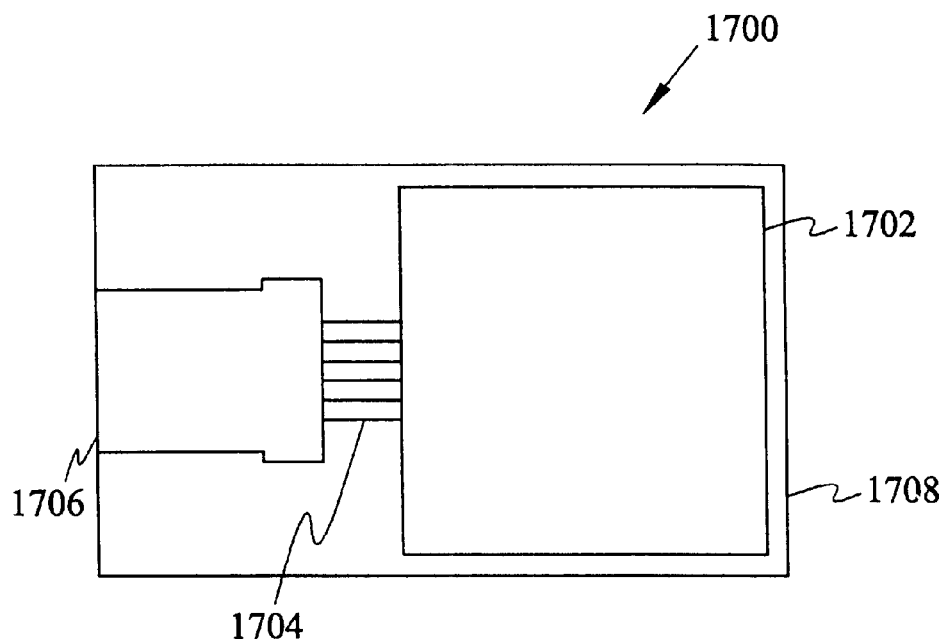
FIG. 17 is a plan view of fiber optical module-on-board interface in accordance with various aspects of the present invention.
Figure 18:
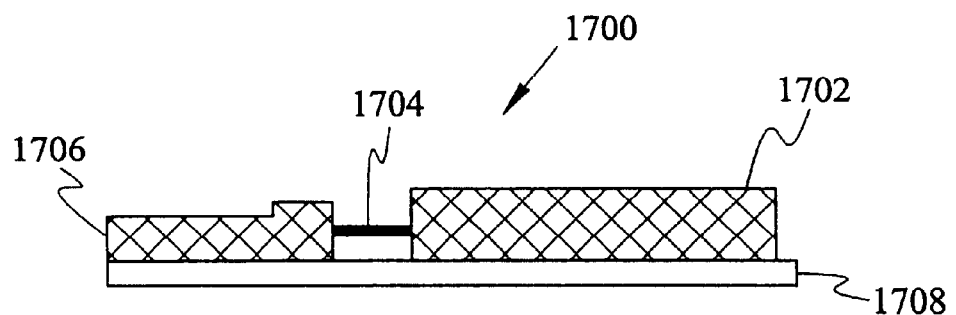
FIG. 18 is an elevational view of the interface shown in FIG. 17.

With reference to FIGS. 17 and 18, a module-on-board interface scheme 1700 includes an opto-electronic package 1702 and a connector receptor 1706 suitably disposed on an integrated circuit board 1708. Optical fibers 1704 connect opto-electronic package 1702 and connector receptor 1706. Connector receptor 1706 is preferably standardized to facilitate flexible connections to other components, circuits, and the like.

Figure 19:
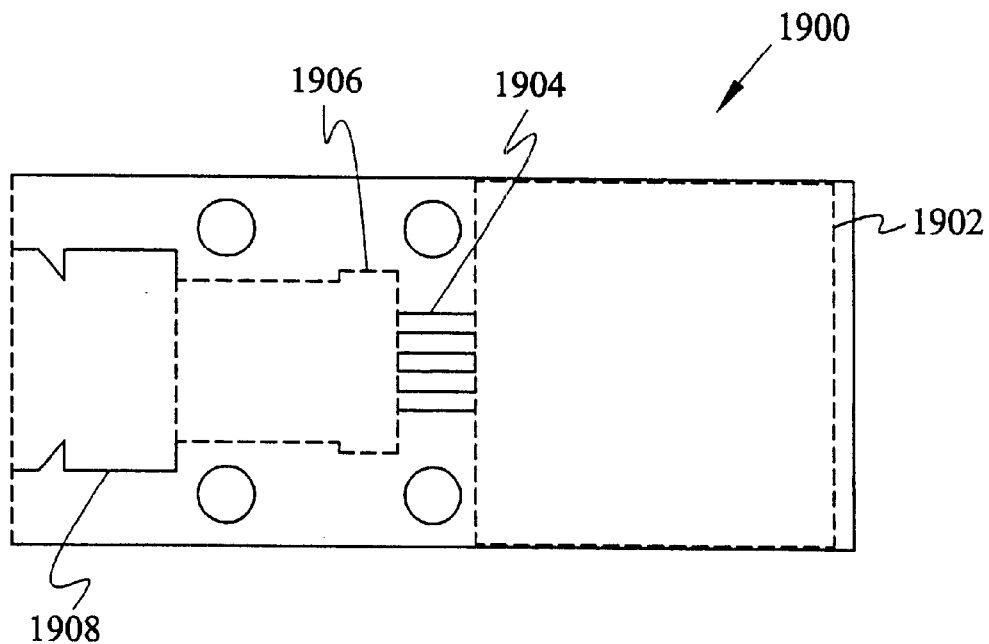
FIG. 19 is a plan view of a fiber optical connectorized module interface in accordance with various aspects of the present invention.
Figure 20:
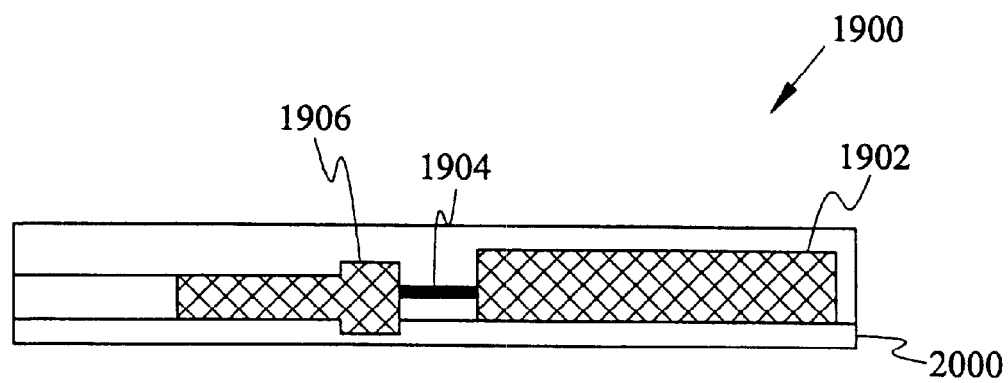
FIG. 20 is a side elevational view of the interface shown in FIG. 19.

With reference to FIGS. 19 and 20, a connectorized-module interface scheme 1900 includes an opto-electronic package 1902 and a connector receptor 1906 suitably disposed within a connectorized housing 2000. Additionally, a coupling recess 1908 is suitably formed in connectorized housing 2000 to engage with a coupling member (not shown). Connector receptor 1906 and coupling recess 1908 are preferably standardized to facilitate flexible connections to other components, circuits, and the like.

Although the present invention has been described in conjunction with particular embodiments illustrated in the appended drawing figures, various modifications may be made without departing from the spirit and scope of the invention as set forth in the appended claims. For example, if hermetic sealing is not required, the present invention may be used in conjunction with nonhermetic packaging by using glue (such as epoxy) seal rather than soldering.

What is claimed is:

1. A package for a component configured to be connected to a connection, comprising:
   a housing having a top and a side for mounting the component, wherein the housing includes a first hole defined through the side for receiving the connection and a second hole defined through the top;
   a sealant disposed in the first hole, wherein the sealant flowed through the second hole and sealed the connection within the first hole; and
   a sleeve surrounding the connection within the first hole, the sleeve being comprised of a material that is at least one of solderable and corrosion resistant.

2. A package according to claim 1, wherein the material is at least one of gold and nickel.

3. A package for a component configured to be connected to a connection, comprising:
   a housing having a top and a side for mounting the component, wherein the housing includes a first hole defined through the side for receiving the connection and a second hole defined through the top; and
   a metal alloy solder sealant disposed in the first hole, wherein the sealant melted and flowed through the second hole and sealed the connection within the first hole.

4. A package for a component configured to be connected to a connection, comprising:
 a housing having a top and a side for mounting the component;
 the housing including a first hole defined through the side for receiving the connection and a second hole defined through the top, wherein the housing is coated with a material that is at least one of solderable and corrosion resistant; and
 a metal alloy solder sealant disposed in the first hole, wherein the sealant melted and flowed through the second hole and sealed the connection within the first hole.

5. A package for a component configured to be connected to a connection, comprising:
 a housing having a top and a side for mounting the component;
 the housing including a first hole defined through the side for receiving the connection and a second hole defined through the top;
 the housing further including a carrier configured to receive the component and a lid attached to the top of the carrier and configured to cover the component, wherein at least one of the first hole and the second hole is formed in the lid; and
 a metal alloy solder sealant disposed in the first hole, wherein the sealant melted and flowed through the second hole and sealed the connection within the first hole.

6. A package for a component configured to be connected to a connection, comprising:
 a housing having a top and a side for mounting the component;
 the housing including a first hole defined through the side for receiving the connection and a second hole defined through the top;
 the housing further including a carrier configured to receive the component and a lid attached to the top of the carrier and configured to cover the component, wherein at least one of the first hole and the second hole is formed in the carrier; and
 a metal alloy solder sealant disposed in the first hole, wherein the sealant melted and flowed through the second hole and sealed the connection within the first hole.

7. A package for a component configured to be connected to a connection, comprising:
 a housing having a top and a side for mounting the component, wherein the housing includes a first hole defined through the side for receiving the connection and a second hole defined through the top, and wherein the housing includes a carrier configured to receive the component and a lid attached to the top of the carrier and configured to cover the component, and wherein the first hole is formed in the carrier and the second hole is formed in the lid; and
 a metal alloy solder sealant disposed in the first hole, wherein the sealant melted and flowed through the second hole and sealed the connection within the first hole.

8. A package for an optoelectronic component configured to be connected to at least one connection, the package comprising:
 a connection slot formed in the packaged for receiving the at least one connection;
 a sleeve surrounding the at least one connection within the connection slot, wherein the sleeve is comprised of a material that is at least one of solderable and corrosion resistant; and
 a sealant slot form in the package proximate to the connection slot, wherein the sealant slot is configured to receive a sealant which flows through the sealant slot and into the connection slot to seal the at least one connection within the connection slot.

9. A package according to claim 8, wherein the material is at least one of gold and nickel.

10. A package for an optoelectronic component configured to be connected to at least one connection, wherein the package includes:
 a connection slot formed in the package for receiving the at least one connection, the connection slot being defined by an inner surface, the inner surface being solderable; and
 a sealant slot formed in the package proximate to the connection slot, wherein the sealant slot is configured to receive a solder sealant which flows through the sealant slot and into the connection slot to hermetically seal the at least one connection within the connection slot.

11. A package for a component configured to be connected to a connection, comprising:
 a housing for mounting the component, the housing having a top and a side, wherein the housing includes a first hole defined through the side for receiving the connection and a second hole defined through the top, the first hole intersecting and opening into the second hole; and
 a metal alloy solder sealant disposed in the first hole, wherein the sealant melted and flowed through the second hole and sealed the connection within the first hole.

12. The package of claim 11, further comprising a sleeve surrounding the connection within the first hole.

13. The package of claim 11, wherein the housing includes at least one groove formed around the first hole to seat the connection.

14. The package of claim 11, wherein the housing is comprised of a material that is at least one of solderable and corrosion resistant.

15. The package of claim 11, wherein the housing is coated with a material that is at least one of solderable and corrosion resistant.

16. The package of claim 11, wherein the housing comprises:
 a carrier configured to receive the component; and
 a lid attached to the top of the carrier and configured to cover the component.

17. The package of claim 16, wherein at least one of the first hole and the second hole is formed in the lid.

18. The package of claim 16, wherein at least one of the first hole and the second hole is formed in the carrier.

19. The package of claim 16, wherein the first hole is formed in the carrier and the second hole is formed in the lid.

20. The package of claim 16, wherein the first hole is formed between the carrier and the lid.

21. A package for a component configured to be connected to a connection, comprising:
 a housing for mounting the component, the housing having a top and a side, wherein the housing includes a first hole defined through the side for receiving the connection and a second hole defined through the top, the first hole intersecting and opening into the second hole; and a sealant disposed in the first hole, wherein the sealant flowed through the second hole and sealed the connection within the first hole; and a sleeve surrounding the connection within the first hole, wherein the sleeve is comprised of a material that is at least one of solderable and corrosion resistant.

22. The package of claim 21, wherein the material is at least one of gold and nickel.

23. The package of claim 21, wherein the sealant comprises at least one of a hermetic sealant, a solderable material, and an epoxy.

24. The package of claim 21, wherein the sealant is a solderable material.

25. The package of claim 21, wherein the sleeve is comprised of a material that is solderable and the sealant is a solderable material.

26. A package for a component configured to be connected to at least one connection, the package comprising:

a housing for mounting a component, the housing having a top and a side;

the housing including a connection slot defined through the side for receiving the at least one connection;

the housing further including a sealant slot defined through the top, the sealant slot intersecting and opening into the connection slot; and a sleeve surrounding the connection within the connection slot, wherein the sleeve is comprised of a material that is at least one of solderable and corrosion resistant.

27. The package of claim 26, wherein the material is at least one of gold and nickel.

28. The package of claim 26, wherein the housing is comprised of a material that is at least one of solderable and corrosion resistant.

29. The package of claim 26, wherein the housing is coated with a material that is at least one of solderable and corrosion resistant.

30. The package of claim 26, wherein the housing comprises:

a carrier configured to receive the component; and a lid attached to the top of the carrier and configured to cover the component.

31. The package of claim 30, wherein at least one of the first hole and the second hole is formed in the lid.

32. The package of claim 30, wherein at least one of the first hole and the second hole is formed in the carrier.

33. The package of claim 30, wherein the first hole is formed in the carrier and the second hole is formed in the lid.

34. A package for a component configured to be connected to at least one connection, the package comprising:

a housing for mounting a component, the housing having a top and a side, wherein the housing includes:

a connection slot defined through the side for receiving the at least one connection;

a sealant slot defined through the top, the sealant slot intersecting and opening into the connection slot;

wherein at least one of the connection slot and the sealant slot comprises an inner surface that is solderable.

35. A package for a component configured to be connected to at least one connection, the package comprising:

a housing for mounting a component, the housing having a top and a side, wherein the housing is coated with a material that is at least one of solderable and corrosion resistant, and wherein the housing includes:

a connection slot defined through the side for receiving the at least one connection; and a sealant slot defined through the top, the sealant slot intersecting and opening into the connection slot;

wherein the connection slot and the sealant slot each comprise an inner surface that is solderable.

36. A package for a component configured to be connected to at least one connection, wherein the package includes:

a connection slot formed in the package for receiving the at least one connection;

a sealant slot formed in the package, the sealant slot intersecting and opening into the connection slot;

wherein at least one of the connection slot and the sealant slot comprises an inner surface that is solderable; and a housing comprising a carrier configured to receive the component and a lid attached to the top of the carrier and configured to cover the component, wherein at least one of the connection slot and the sealant slot is formed in the lid.

37. A package for a component configured to be connected to at least one connection, wherein the package includes:

a connection slot formed in the package for receiving the at least one connection;

a sealant slot formed in the package, the sealant slot intersecting and opening into the connection slot;

wherein at least one of the connection slot and the sealant slot comprises an inner surface that is solderable; and a housing comprising a carrier configured to receive the component and a lid attached to the top of the carrier and configured to cover the component, wherein at least one of the connection slot and the sealant slot is formed in the carrier.

38. A package for a component configured to be connected to at least one connection, wherein the package includes:

a connection slot formed in the package for receiving the at least one connection;

a sealant slot formed in the package, the sealant slot intersecting and opening into the connection slot;

wherein the connection slot and the sealant slot each define an inner surface that is solderable; and a housing comprising a carrier configured to receive the component and the housing also comprising a lid attached to the top of the carrier and configured to cover the component, wherein the connection slot is formed in the carrier and the sealant slot is formed in the lid.

39. A package for a component configured to be connected to at least one connection, wherein the package includes:

a connection slot formed in the package for receiving the at least one connection;

a sealant slot formed in the package, the sealant slot intersecting and opening into the connection slot;

wherein the connection slot and the sealant slot each define an inner surface that is solderable; and a metal alloy solder sealant disposed in the connection slot, wherein the sealant melted and flowed through the sealant slot and sealed the connection within the connection slot.

40. A package for a component configured to be connected to at least one connection, wherein the package includes:

a connection slot formed in the package for receiving the at least one connection;

a sealant slot formed in the package, the sealant slot intersecting and opening into the connection slot;

a sealant disposed in the connection slot, wherein the sealant flowed through the sealant slot and sealed the connection within the connection slot; and a sleeve surrounding the connection within the connection slot, wherein the sleeve is comprised of a material that is solderable and the sealant is a solderable material.

41. A package for a component configured to be connected to a connection, comprising:

a housing for mounting the component, the housing having a top and a side, the top and the side defining a first cavity;

the housing including a first hole defined through the side for receiving the connection and a second hole defined through the top;

wherein the first hole intersects and opens into the second hole, the first hole and the second hole thus defining a second cavity; and a metal alloy solder sealant disposed in the first hole, wherein the sealant melted and flowed through the second hole and sealed the connection within the first hole.

* * * * *